(12) United States Patent
Khouri et al.

(10) Patent No.: US 6,563,737 B2
(45) Date of Patent: May 13, 2003

(54) READING CIRCUIT FOR SEMICONDUCTOR NON-VOLATILE MEMORIES

(75) Inventors: Osama Khouri, Milan (IT); Alessandro Manstretta, Pavia (IT); Guido Torelli, S'Alessio con Vialone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/953,070

(22) Filed: Sep. 13, 2001

(65) Prior Publication Data

US 2002/0057604 A1 May 16, 2002

(30) Foreign Application Priority Data

Sep. 15, 2000 (IT) .......................................... MI00A2018

(51) Int. Cl.[7] .............................................. G11C 16/06
(52) U.S. Cl. .............................. 365/185.21; 365/185.2; 365/189.07
(58) Field of Search ...................... 365/185.21, 185.2, 365/185.25, 189.07, 204, 207, 210

(56) References Cited

U.S. PATENT DOCUMENTS 5,563,826 A  * 10/1996 Pascucci et al. ......... 365/185.2

* cited by examiner

Primary Examiner—David Lam
(74) Attorney, Agent, or Firm—Lisa K. Jorgenson; E. Russell Tarleton; SEED IP Law Group PLLC

(57) ABSTRACT

A reading circuit for semiconductor non-volatile memories connected to at least one selected cell and at least one reference cell, the circuit including current/voltage conversion circuits receiving a first current flowing through the selected cell and a second current flowing through the reference cell and providing respectively on a first circuit node a first selected cell voltage and on a second node a second reference cell voltage, at least one differential amplifier connected at the input of the first and the second nodes and having an output terminal to provide a logic signal correlated to the selected cell information, a first voltage-controlled discharge switch circuit connected to the first node and to a voltage reference, a second switch circuit connected to the second node and the voltage reference, and first and second voltage comparator circuits receiving the first selected cell voltage and the second reference cell voltage.

20 Claims, 6 Drawing Sheets

READING CIRCUIT FOR SEMICONDUCTOR NON-VOLATILE MEMORIES

BACKGROUND OF THE INVENTION

1. Field of the Invention

The present invention relates to a reading circuit for semiconductor non-volatile memories.

More specifically, the invention relates to a reading circuit for semiconductor non-volatile memories connected to at least one selected cell and to at least one reference cell, comprising current/voltage conversion circuits receiving at the input thereof a first current flowing through the selected cell and a second current flowing through the reference cell and providing respectively on a first circuit node a first selected cell voltage and on a second node a second reference cell voltage, as well as at least one differential amplifier, connected at the input of said first and second nodes and having an output terminal effective to supply the information stored in said selected cell.

The invention relates particularly, but non-exclusively, to a reading circuit for semiconductor non-volatile memories suitable for digital applications and implemented in CMOS technology, and the following description is given with reference to this field of application for convenience of illustration.

In particular, said circuit can be used both in conventional memories in which each memory element, or "memory cell", stores an information bit (generally referred to as "two-level memories") and in memories in which each memory element is capable to store more than one bit (generally referred to as "multilevel memories").

Moreover, the circuit according to the invention can be used for information reading in non-volatile memories of the Flash, EPROM, EEPROM and OTP (One-Time Programmable) type.

2. Description of the Related Art

As is well known, a semiconductor non-volatile memory is a quite complex system. For example, as schematically shown in FIG. 1, a Flash memory 1, i.e., a memory whose cells are electrically programmable and erasable in great bulks, generally referred to as blocks or sectors, conventionally comprises:

a cell matrix 2, representing memory 1 core;

a decoding section, required to address the cells of the word to be selected during a particular programming or reading operation, as well as the sector or sectors to be erased during a particular erasing operation, and comprising essentially a line decoder 3 and a column decoder 4, both connected to said cell matrix 2;

a reading section, which performs the reading of the addressed cells and transmits the read data to output circuits, as well as an input/output section, which serves as interface for the insertion from the outside of the data to be stored in the addressed cells during a writing operation and for the transfer to the outside of the data concerning the read cells: said sections are schematically shown in FIG. 1 by means of a sense amplifier 5, regulators 6 connected to line decoders 3 and column decoders 4, and at least one output buffer 7 connected to said sense amplifier 5; and finally, a supporting section comprising the circuits required to perform the above-described operations such as, for example, voltage step-up circuits 8 for generating the voltages required for performing programming and erasing operations in one-supply memories and connected to said regulators 6, a state machine for an appropriate timing of the various operations (not shown).

It is also worth noting that an EPROM memory is a quite complex system, even though less complex than a Flash memory since it does not comprise some of the above-mentioned blocks (such as, for example, voltage step-up circuits 8 and matrix cell erasing circuits, erasing being performed in this type of memories through ultraviolet ray exposure). Therefore, the comments made with reference to Flash memories apply also to EPROM memories.

It is worth remembering that the information storage, in the case of conventional two-level memory cells, corresponds to the conduction or shutdown state of a floating gate transistor, which are associated with the logic values "1" and "0". The two-level memory cell threshold voltage is high (Vthp) or low (Vthe) depending on the stored state, i.e., the charge stored in the floating gate terminal.

By using a greater number of charge values to be stored in the floating gate terminal than the two above-mentioned high and low threshold values, it is possible to increase the storage capacity, given the same cell size and technology. This is the case of "multilevel" cells.

More particularly, by using, for example, four different charge levels, corresponding to four different floating gate transistor conduction states, two bits can thus be coded in one cell, doubling therefore the cell information content, given the same area covered by the cell and thus by the whole memory.

Multilevel cells are generally inserted in a NOR-type architecture, so that a state stored in a cell is effective to inhibit the floating gate transistor conduction included therein during a reading operation, as is the case with "0" programmed cells in two-level cell devices, the remaining states being such as to provide different conduction conditions of the selected cell.

In the above-mentioned case of four programmable levels (two bits per cell) the cell threshold voltage can have one of the four possible values Vth0, Vth1, Vth2, Vth3, a two-bit binary configuration corresponding to each value.

The advantages in terms of storage capacity provided by a multilevel cell memory are however accompanied by considerable problems. These problems are mainly due to the reduced difference between the different memory cell conduction levels, i.e., between the threshold voltages corresponding to the different charge levels which can be stored in the floating gate terminal of the transistors included in the memory cells.

Said reduced difference between the threshold voltage levels involves serious problems in terms both of design (for example of programming and reading circuits) and of reliability of the whole memory device.

More particularly, in known memory devices, the reading circuit (essentially a sense amplifier), performs the fundamental function of comparing two current values, the one delivered by a selected cell and the other by the corresponding reference cell, and of outputting a voltage level corresponding to said comparison result. In a two-level cell, sensing margins, considered as the lowest current difference detectable at the sense amplifier inputs, are conveniently relaxed and the current comparison is performed without endangering the reading speed. In the case of four-level cells, the allocation of the different state distributions imposes more severe requirements on the reading circuit design than in the conventional two-level cell case.

The multilevel cell reading circuits are therefore more constrained by the need for high sensitivity, in order to discriminate very small signal differences at the inputs thereof. This feature poses specific design problems linked to the need for accuracy and, moreover, it does not meet the high speed requirement of the reading circuit sense amplifier.

More particularly, the sense amplifier must necessarily be highly sensitive, without endangering the reading speed. In fact, the sense amplifier sensitivity must be lower than the minimum distance in current between the level distribution and the adjacent references thereto.

If a read path is considered, the information supplied by the sense amplifier, which performs, as above described, the function of showing the content of the addressed cell it refers to, is generally stored in a register or "latch" which drives the driving circuit or output buffer ("data output buffer"), which performs the function of delivering the read data to external circuitries, which, according to the output buffer, can be modeled into a generally heavy capacitive load. The latch is generally used to keep the output buffer driving level constant for a predetermined period of time in order to make the output data transfer safe and reliable. The time instant for storing the information supplied by the sense amplifier must clearly be such as to ensure that the information outputted by the sense amplifier is correct, i.e., corresponding to the data stored in the non-volatile memory cell. In fact the sense amplifier takes a little time to output a voltage level being sufficiently high to be univocally interpreted and, thus, correctly stored in the latch.

In this respect, it is worth noting that a modern memory device comprises several output buffers suitable for simultaneous switching, and that the memory often comprises highly complex digital circuitry. Due to the commutations of these buffer outputs, which must generally drive considerably high capacitive loads (about 100pF), the commutations of the phase generator drivers for charge pumps and, sometimes, also the commutation of several memory logic gates, the memory supply lines (generally indicated by VDD and VSS) often undergo undesirable voltage peaks ("glitch" or "spike") which generally make the lines highly noisy; said noise inevitably spreads over the whole memory circuitry and, particularly, also over the reading circuit sense amplifiers.

In order for the memory cell reading to be conveniently noise-insensitive, the voltage level outputted by the reading circuit sense amplifier when the data is stored in the latch must be sufficiently high: only then said voltage can be certainly distinguished from the noise, the corresponding information being thus correctly interpreted by the latch in which it is stored and, consequently, by the downstream output buffer.

The reading circuit sense amplifier immunity to noise is therefore essential for the correct operation of a semiconductor non-volatile memory.

Compromise design solutions between the above-described different needs are known.

For example, the process of dividing supply lines so that the reading circuit logic section has distinct and dedicated lines with respect to the analogue section lines, in order to reduce noises in said lines, is known.

Even with this expedient, the problem of noise in supply lines still exists, and it is still more evident in multilevel memories because of the reduced difference between the levels to be discriminated.

In addition, multilevel non-volatile memory reading circuits are based on the comparison between the cell current and the current of a conveniently programmed reference cell.

Such a solution is disclosed for example in European patent application no. 96830494.9 entitled "Reading circuit for semiconductor memory cells" filed in the name of the applicant for this invention and schematically shown in FIG. 2.

In said application, the discrimination between a memory cell current and a reference cell current is performed through the constant current capacity charge law. In particular, a current Iref flowing through the reference cell is compared with a current Isel flowing through the selected cell, said currents differing from each other by a minimum value which is equal to about 10 $\mu$A in the case of four level cells implemented with present submicrometric technologies.

As shown in FIG. 2, the device 9 comprises two distinct circuit elements and, in particular, a pair of NMOS-type transistors MS1 and MS2 effective to ground the nodes X1 and X2 receiving said currents Iref and Isel respectively and connected to a ground reference GND by means of corresponding capacitors C1 and C2 which serve as integrators and are indicated by the reference numbers 9a and 9b.

The transistors MS1 and MS2 are inserted between said nodes X1 and X2 and the ground reference GND and have control terminals cross-connected to the nodes X2 and X1 respectively. Therefore, said transistors MS1 and MS2 have a threshold voltage Vth and are controlled by the voltages Vref and Vsel of the nodes X1 and X2 and correlated to the reference cell current Iref and the selected cell current Isel.

It is worth noting that the presence of discharge transistors MS1 and MS2 avoids the simultaneous saturation of the voltages Vref and Vsel to the supply voltage VDD, so that the two voltages are then conveniently split, even when the transient is exhausted.

More particularly, since the two capacitors C1 and C2 serve as respective integrators 9a and 9b, identical in type and value, the highest voltage between Vref and Vsel at a predetermined time corresponds to the highest current between Iref and Isel. Therefore, one of the two nodes X1 and X2 achieves first the starting voltage of the corresponding discharge transistor MS1 or MS2, which, in this case, corresponds to the threshold voltage Vth. The discharge transistor MS1 or MS2 then activates the discharge of the node X1 or X2 with lowest voltage.

The voltage value activating a discharge transistor is referred to hereinafter as "freezing voltage" since it determines the indefinite "storage" of the information relating to the current comparison, which will be then detected through a differential amplifier AD having input terminals connected to said nodes X1 and X2 and an output terminal OUT.

Moreover, the discharge transistors MS1 and MS2 enable the storage of their difference sign and make the discrimination through the downstream differential amplifier AD more reliable. In fact, without avoiding the saturation of both voltages to the supply value VDD when transient is exhausted, it would be difficult to select the instant for storing in the downstream latch the information outputted by the sense amplifier. In fact, said instant must not be too advanced or suitable to ensure a sufficiently high signal value (equal to the module Vref−Vsel) outputted by the sense amplifier; moreover, without avoiding the saturation of both voltages to the supply VDD, the instant for storing in the latch must not be too delayed since it would alter the correct data evaluation.

In other words, the determination of the data "freezing" instant is quite difficult for this type of sense amplifier, also because of process and environmental/operating variations undergone by the reading circuit during the manufacturing and operation thereof.

Moreover, said known structure has some drawbacks. In particular, a prior art sense amplifier allows the correct evaluation of a difference |Vref−Vsel| only if higher than a minimum value Vm, also referred to as "margin voltage". In general, the margin voltage Vm depends on both the accuracy of the input voltage of the differential amplifier AD and the noise margin associated to the input signals. For convenience, said value Vm corresponds to the voltage accuracy of a discrimination stage comprising a CMOS technology differential amplifier which equals, for example, to about 50 mV less the offset voltage.

The reading circuit sensitivity depends therefore on the voltage difference between Vref and Vsel.

On the contrary, the transistor MS1 and MS2 operation is based on a positive reaction, characterized by high speed. It is therefore necessary that this operation is activated when the absolute value of the difference |Vref−Vsel| reaches a safety value, higher than the present electric noise. In the opposite case, the noise could trigger the positive reaction in a way opposite to the correct procedure, resulting then in a wrong reading.

In particular, for a correct discrimination, the transistor MS1 start-up (and, similarly, for transistor MS2) should be performed only after the detection of the voltage difference |Vref−Vsel| by the differential amplifier AD.

With the above-described known circuit structure, the voltage required for starting the "freezing" operation, or "freezing voltage", coincides then with the transistor NMOS threshold voltage Vth. Said reference value depends on both technologic (doping concentration, etc) and circuit (substrate-source voltage) factors. With the present submicrometric CMOS technologies, the threshold voltage Vth value of a low-voltage NMOS transistor is equal to about 0.7–0.8 V, while for the so-called natural transistors it is equal to about 0.1–0.3 V.

Taking into consideration values compatible with CMOS processes, for example Vth=700 mV, Isel=100 $\mu$A, Iref=90 $\mu$A, Vm=50 mV, it derives that Vsel=10*Vm=500 mV (independently of the capacity value). Said Vsel value is therefore quite near to the starting threshold value Vth of the MS1 transistor. Moreover, the voltage Vth is subject both to process variations (the threshold voltage in CMOS technology can vary even by +/−10%) and to environmental condition variations (the threshold voltage thermal drift in CMOS processes is of about −2mV/degC).

All these aspects make thus the above-described known circuit structure intrinsically critical if the currents to be discriminated are reciprocally "near" and relatively high in absolute value.

In fact, if the difference |Vref−Vsel| value is still very low when the voltages Vref and Vsel reach values near to Vth, the electric noise can take the lowest of the two voltages Vref or Vsel above Vth, activating thus the positive reaction. In these cases, the time evolution of the voltage signals Vsel and Vref is inverted, a wrong information about the difference between the currents Isel and Iref being consequently stored.

For these reasons, a "freezing" voltage value should be provided, which is adequately protected from process/environmental variations and particularly as much as possible immune to the noise of the memory device, differently from what happens in the prior art solution.

Briefly, known circuit solutions for reading (sensing) a non-volatile memory cell are not strong enough when electric noise is present in the device.

BRIEF SUMMARY OF THE INVENTION

The technical problem underlying the present invention is to provide a reading circuit for non-volatile memories with such structural and functional characteristics as to overcome the drawbacks that still limit prior art reading circuits.

In particular, the reading circuit for non-volatile cells according to the invention has the following features:

high sensitivity, low evaluation time, and high noise immunity.

The circuit is therefore suitable for application particularly for multilevel memory reading, even if it can be efficiently applied also with conventional two-level memories.

The disclosed embodiments of the present invention provide, in a reading circuit, adequate dedicated circuit blocks in order to make the information discrimination reliable even when noises and/or electric noise are present.

A reading circuit for semiconductor non-volatile memories connected to at least one selected cell and at least one reference cell is provided. The reading circuit includes current/voltage conversion circuits receiving at the input a first current flowing through the selected cell and a second current flowing through the reference cell and providing respectively on a first circuit node a first selected cell voltage and on a second node a second reference cell voltage; at least one differential amplifier having inputs connected to the first and second nodes and having an output terminal effective to supply a logic signal correlated to the information contained in the selected cell; at least one first voltage-control discharge switch circuit connected to the input of the first node and to a voltage reference, a second voltage-control discharge circuit connected to the input of the second node and to the voltage reference; and at least a first and a second voltage comparator circuit receiving at the input thereof the first selected cell voltage and the second reference cell voltage, the comparator circuits configured to control in voltage the switch circuits.

In accordance with another aspect of the present invention, the comparator circuits are differential comparators of the module for absolute value of the difference between the selected cell voltage and the reference cell voltage with respect to a value corresponding to a tripping voltage for the start-up of the discharge switch circuits, the value being a fixed voltage reference.

The features and advantages of the reading circuit according to the invention will become apparent from the following description of embodiments thereof given by way of non limiting example with reference to the accompanying drawings.

DETAILED DESCRIPTION OF THE INVENTION

Figure 1:
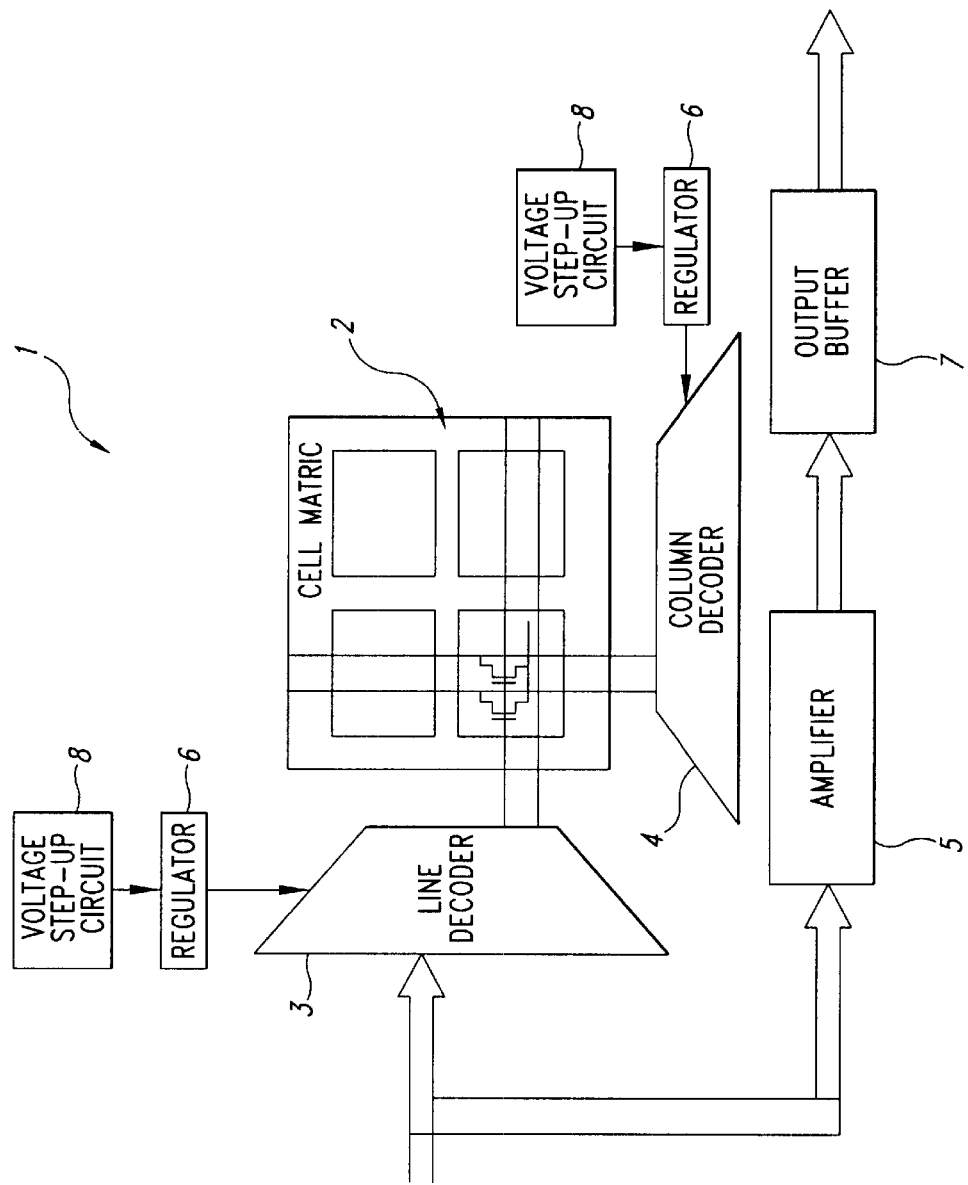
FIG. 1 is a schematic view of a prior art memory architecture.
Figure 2:
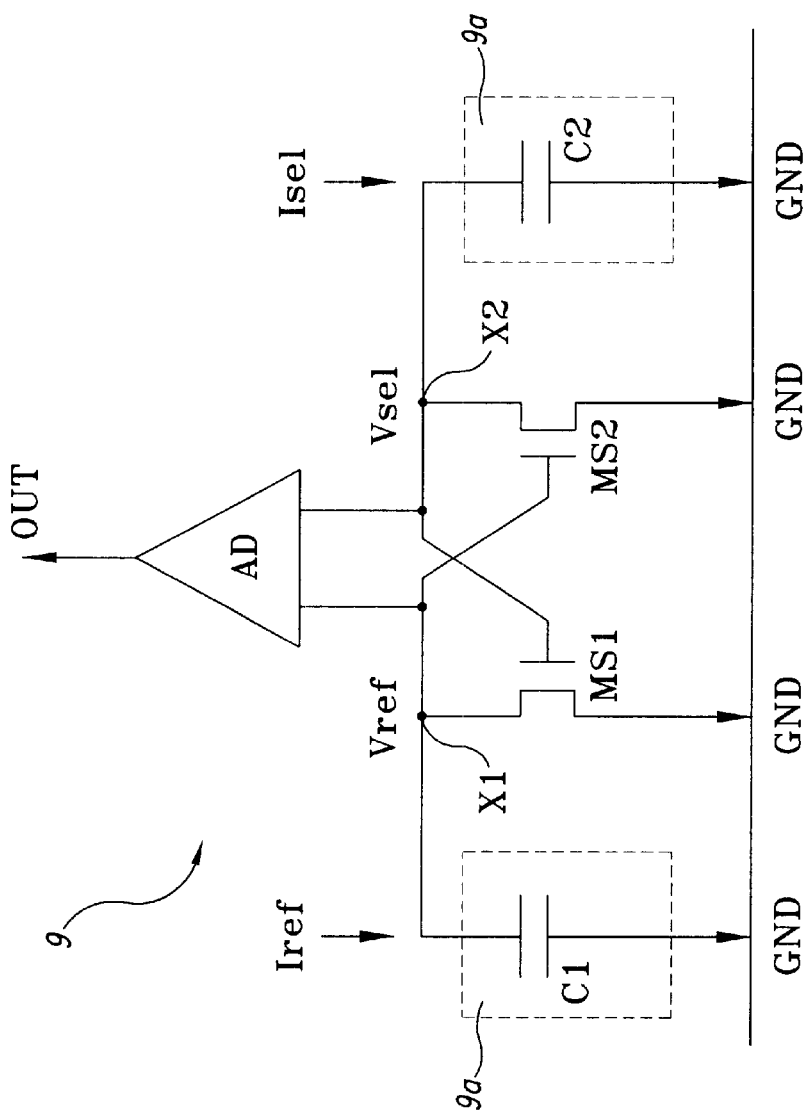
FIG. 2 is a schematic view of a reading circuit for semiconductor non-volatile memories.
Figure 3:
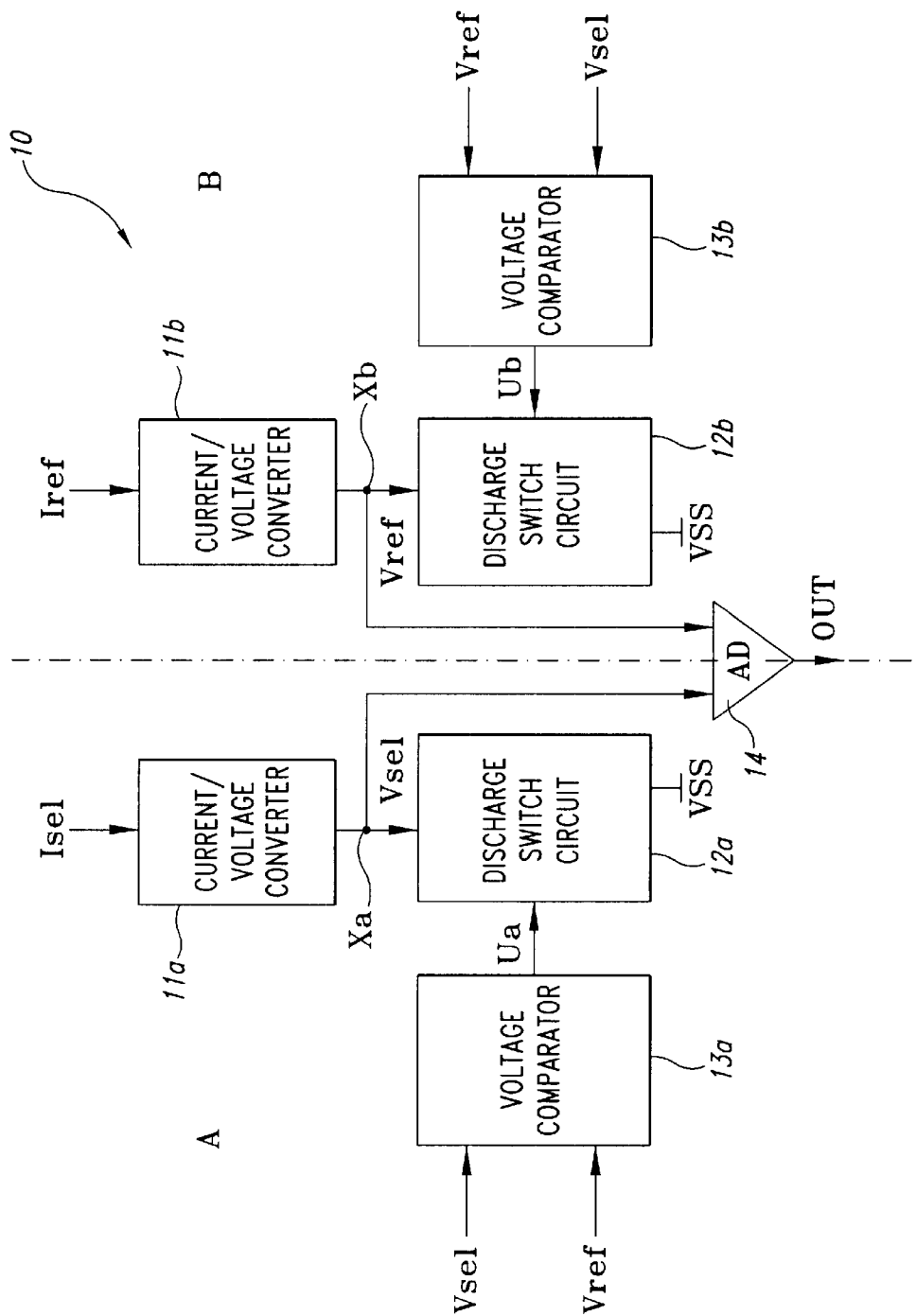
FIG. 3 is a schematic view of a reading circuit for semiconductor non-volatile memories according to the invention.

With reference to the drawings, and particularly to FIG. 3, a reading circuit for semiconductor non-volatile memories according to the invention is generally and schematically indicated with 10.

The reading circuit 10 according to the invention has a symmetrical structure comprising a section A relating to the selected cell and a section B relating to the reference cell.

In particular, the reading circuit 10 comprises integration current/voltage (I/V) conversion circuits 11a and 11b receiving the selected cell current Isel and the reference cell current Iref respectively and outputting the corresponding voltages Vsel and Vref.

Moreover, the reading circuit 10 comprises voltage-controlled discharge switch circuits 12a and 12b connected at the input of said integration current/voltage (I/V) conversion circuits 11a and 11b in correspondence with nodes Xa and Xb, as well as to voltage comparator circuits 13a and 13b receiving at the input thereof both voltages Vsel and Vref relating to the selected and the reference cells.

More particularly, the current/voltage conversion circuits 11a and 11b generate on the nodes Xa and Xb respective voltage values Vsel and Vref having amplitude correlated by an increasing function to the current values Isel and Iref received at the input thereof. In a preferred embodiment, said correlation can be proportional. Moreover, the amplitude of said voltage values Vsel and Vref is correlated also to the time lapsed from a starting condition (conventionally indicated by t0) in which the voltages Vsel and Vref are predetermined at an initial value, for example a voltage reference VSS. In a preferred embodiment, the voltage reference VSS can be, for example, the ground voltage reference GND. In other words, from the instant t0, the voltage value generated on the nodes Xa and Xb increases like a ramp, from the voltage VSS, proportionally to the time lapsed ($t \geq t0$) and to the currents Isel and Iref.

The integration current/voltage (I/V) conversion circuits 11a and 11b are connected also to the inputs of a differential amplifier 14, having an output terminal OUT effective to supply the selected cell information.

The differential amplifier 14 provide the output terminal OUT with a logic value corresponding to the value stored in the selected cell or the negative thereof according to the logic implemented through the reading circuit 10.

It is worth noting that the comparator circuits 13a and 13b control the switch circuits 12a and 12b.

In particular, each comparator circuit 13a or 13b compares the difference module between the voltages Vref and Vsel (|Vref−Vsel|) with a tripping voltage, which is Vm. The tripping voltage Vm is a fixed reference corresponding to the "freezing" voltage or the threshold voltage for the start-up of the discharge switch circuit 12a or 12b.

The comparator circuits 13a and 13b provide the discharge switch circuits 12a and 12b with respective digital control signal Ua and Ub having complementary logic values according to the result of the comparison between the module |Vref−Vsel| and the tripping voltage Vm. For example, it can be assumed that the digital signals Ua and Ub have high logic value when the module |Vref−Vsel| is higher than the tripping voltage Vm and, vice versa, low logic value when the module |Vref−Vsel| is lower than the tripping voltage Vm.

Therefore, the discharge switch circuits 12a and 12b activate the connection of the nodes Xa and Xb to the voltage reference VSS according to the value of the digital control signal Ua and Ub they receive at the input thereof by the comparator circuits 13a and 13b.

The tripping voltage value Vm is so predetermined as to be |Vref−Vsel|>= Vm at the "freezing" instant, in order to increase the noise immunity margin of the reading circuit 10.

The discharge of the voltage node Xa or Xb with slowest variation is therefore activated when the voltage reference |Vref−Vsel| is equal to Vm, in order to ensure the correct reading of the selected memory cell content.

It can thus be stated that the logic value at the output terminal OUT of the amplifier 14 is correlated to the difference module between the voltages Vref and Vsel (|Vref−Vsel|).

Figure 4:
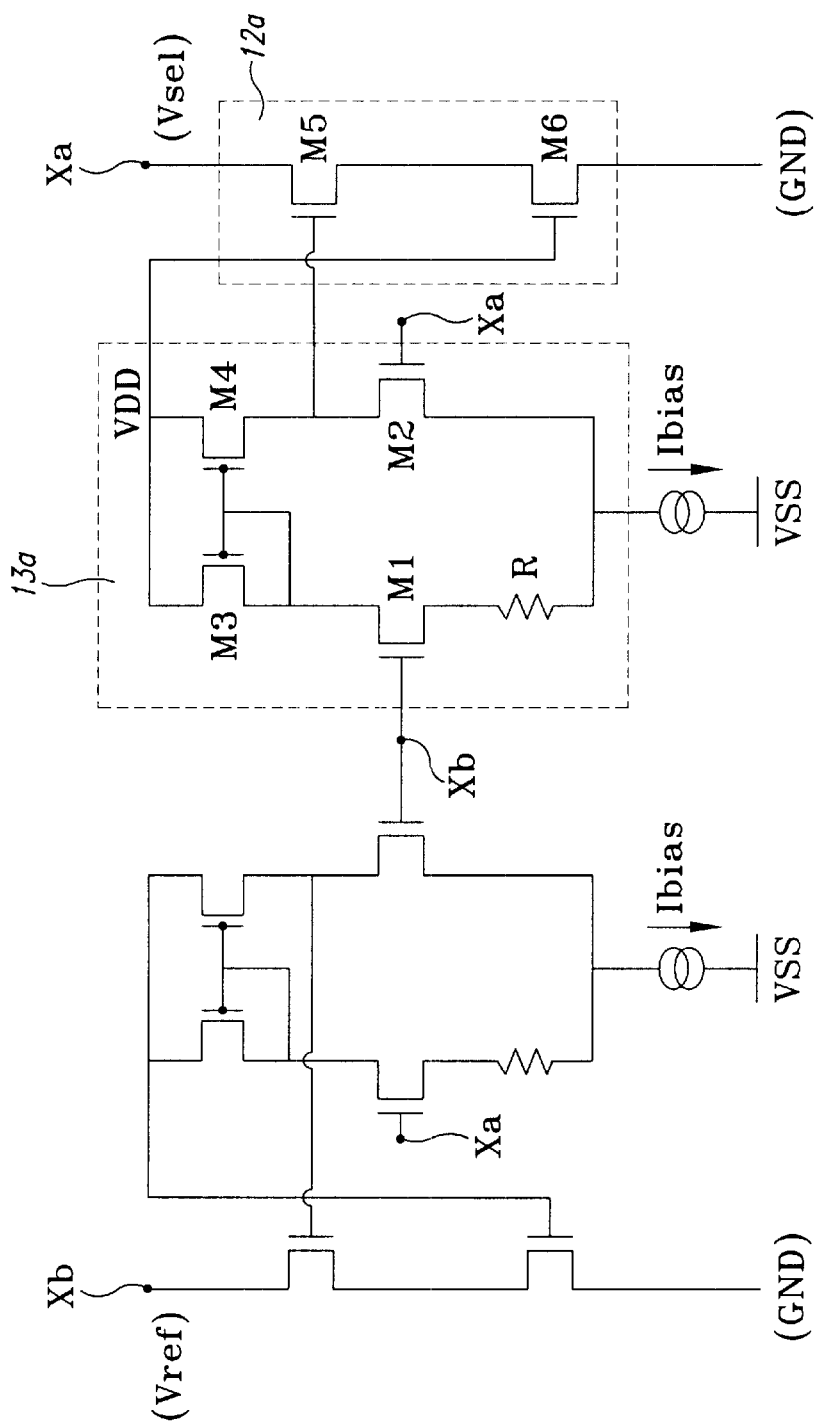
FIG. 4 is a more detailed view of a possible implementation of the reading circuit of FIG. 3.

FIG. 4 shows in greater detail an example of circuit implementation for the reading circuit 10, given by way of non limiting example.

With reference to the section A of the reading circuit 10 relating to the selected cell, the comparator circuit 13a has been implemented, for example, through an offset differential amplifier, comprising the n-channel transistors, M1 and M2, and the p-channel transistors, M3 and M4, inserted between a first VDD and a second supply line VSS of the reading circuit 10.

More particularly, the transistors M3 and M4 have the source terminals connected to the first supply line VDD, the gate terminals reciprocally connected and the drain terminal connected to the respective transistors M1 and M2 drain terminals. Moreover, the transistor M3 is a diode-configuration, with the drain terminal connected to the gate terminal.

The transistors M1 and M2 have, in turn, the source terminal connected to each other and to the second supply line VSS through a bias current Ibias generator and the gate terminals connected to nodes Xb and Xa respectively, receiving the voltages Vref and Vsel relating to the reference cell and to the selected cell.

Advantageously according to the invention, the offset differential amplifier 13a comprises a resistance R, inserted between the transistor M1 source terminal and the bias current Ibias generator, suitable for fixing a tripping voltage Vm value of the offset differential amplifier 13a.

Moreover, the offset differential amplifier 13a controls the activation of the discharge switch circuit 12a comprising the n-channel transistors M5 and M6 inserted, in series, between the slow-variation node Xa and a ground voltage reference GND.

In fact, advantageously according to the invention, the offset differential amplifier 13a transistors M4 and M2 have the drain terminals in common connected to the gate terminal of the discharge switch circuit 12a transistor M5, while the transistor M6 has the gate terminal connected to the first supply line VDD.

The bias current Ibias generator biases the offset differential amplifier 13a. The active current mirror formed by the offset differential amplifier 13a transistors M3 and M4 is so selected as to present a unity factor current gain In practice, the control of the impedance between the nodes Xa and GND of the discharge switch circuit 12a is substantially performed at a voltage corresponding to the difference of the voltages Vsel and Vref.

The advantage of this type of control is that the reading circuit 10 freezing voltage does not depend on the supply voltage VSS and the undesirable phenomena (particular capacitive couplings and electric noise) present therein do not influence the reading circuit 10 operation.

The reading circuit 10 shown in FIG. 4 is an example of offset amplifier, in which the unbalance is obtained by differentiating the electric path in the two branches of the differential stage.

Further possible implementations can be realized from a differential amplifier base circuit, for example by differently sizing the transistors M1 and M2 gate areas, or by designing a different mirror relation between the bias currents of M1 and M2 through a different mirror relation between M3 and M4.

When the resistance R value is 0, the offset differential amplifier 13a has a sensitivity equal to about 50 mV, excluding the random offset Voff,int generated by process variations.

By conveniently designing said resistance R ohm value, it is possible to obtain a predetermined voltage drop at the terminals thereof, for a given bias current Ibias.

In this way, the complete switching of the offset differential amplifier 13a output is performed when the difference Vref (voltage on the node Xb) and Vsel (voltage on the node Xa) is higher than Vm=Voff,int+R*Ibias.

For example, with the CMOS technological process typical values, given Ibias=50 μA and R=10 KOhm, it is possible to obtain a tripping differential threshold Vm of about 500 mV, which is sufficient for application on multilevel cells.

Figure 5:
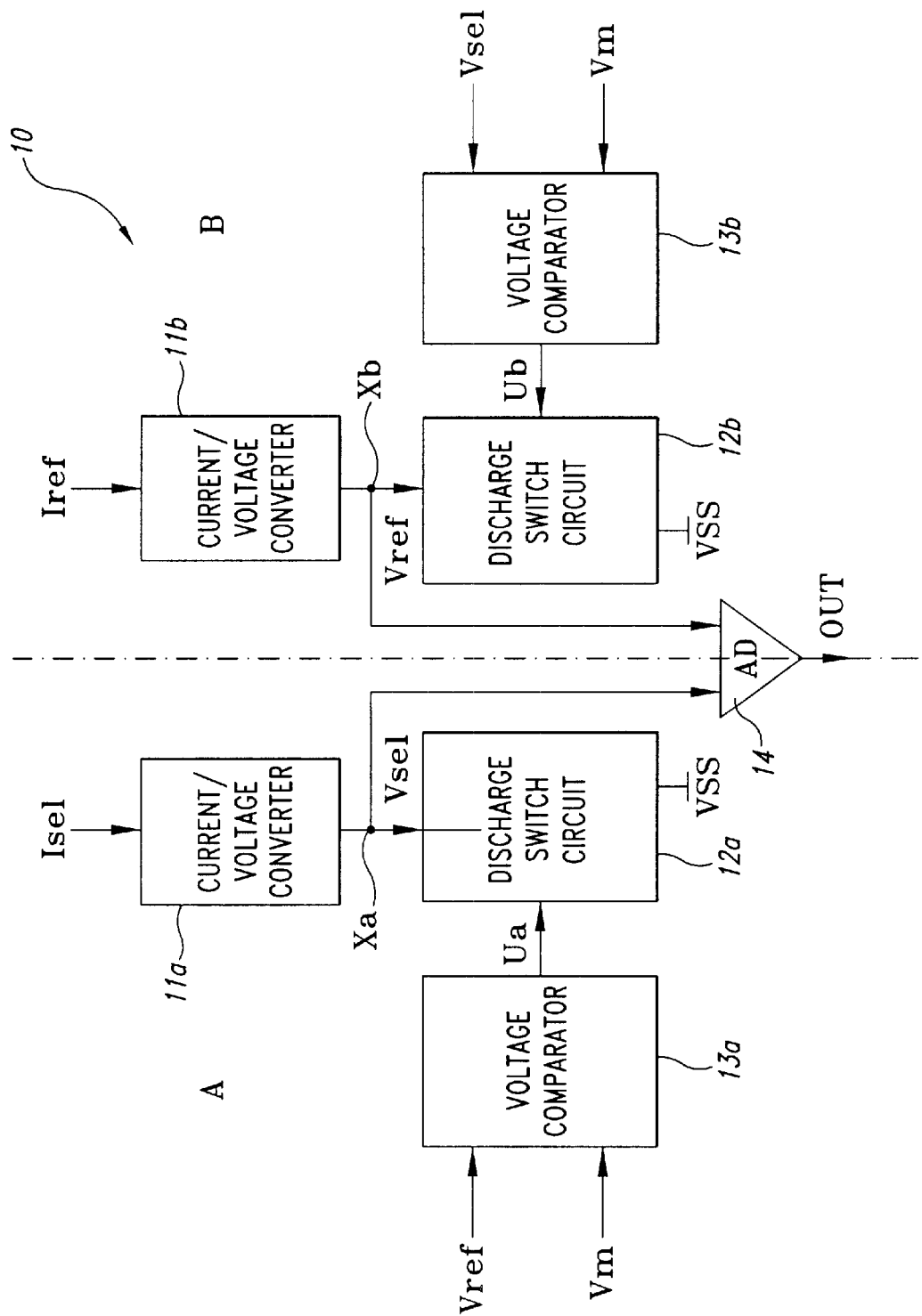
FIG. 5 is a schematic view of a further embodiment of a reading circuit of semiconductor volatile memories according to the invention.

A further embodiment of the reading circuit 10 is schematically shown in FIG. 5. In particular, the comparator circuit 13a receives at the input thereof the reference cell voltage Vref and a constant freezing voltage Vm, while the comparator circuit 13b receives at the input thereof said freezing voltage Vm and the selected cell voltage Vsel. The Vm value is so predetermined as to be |Vref−Vsel|>=Vm at the freezing instant, in order to increase the noise immunity margin.

In particular, the discharge of the voltage node with slowest variation is therefore activated when the node with fastest variation reaches the voltage Vm, in order to ensure the correct reading of the memory cell content.

Figure 6:
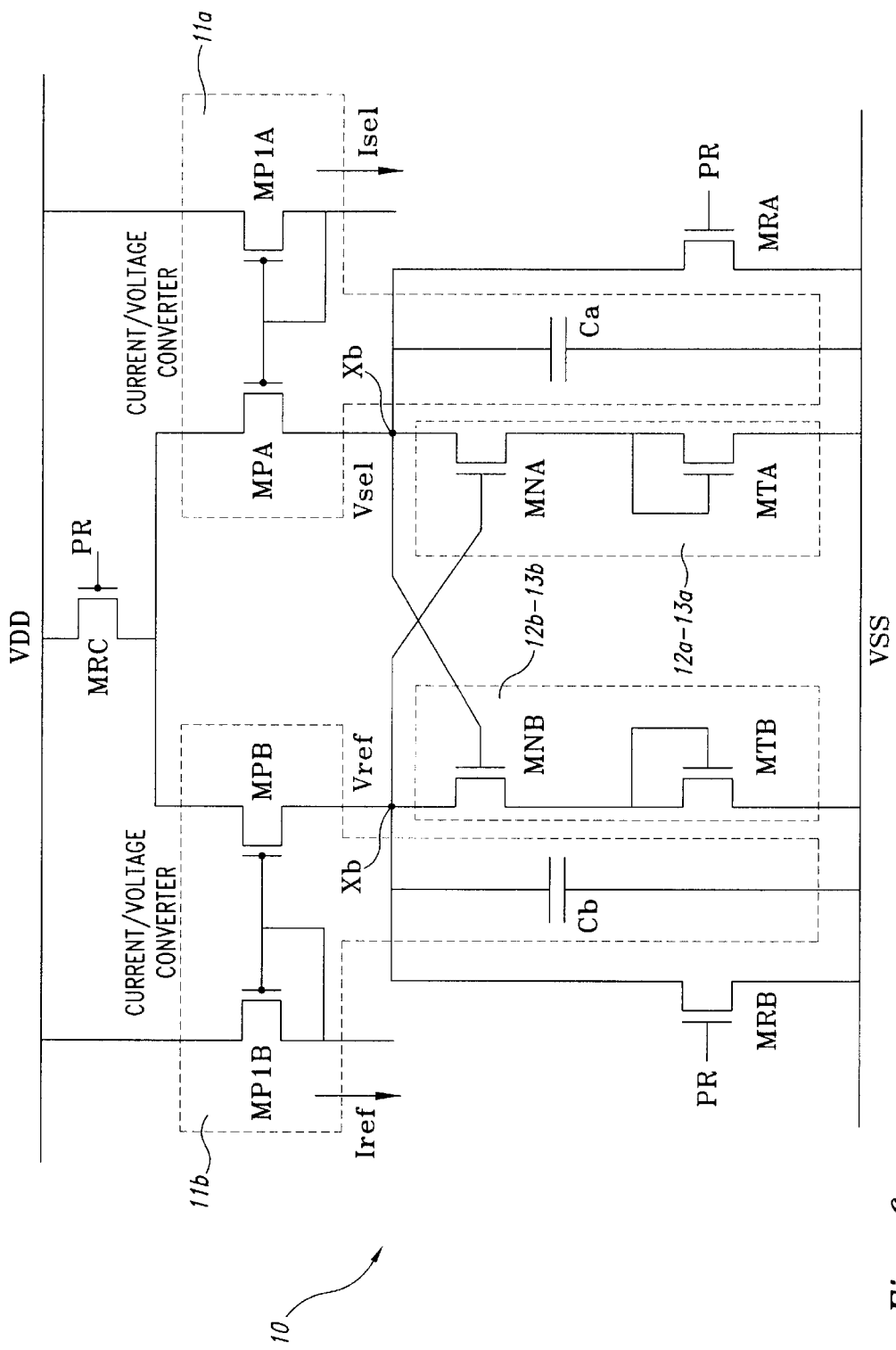
FIG. 6 is a more detailed view of a possible implementation of the reading circuit of FIG. 5.

FIG. 6 shows a possible circuit implementation of the reading circuit further embodiment according to the invention shown in FIG. 5.

The reading circuit 10 further embodiment shown in FIG. 6 has a base structure which is similar to prior art circuits.

In particular, the reading circuit 10 is inserted between a first VDD and a second VSS supply lines and has a first MNA and a second MNB comparing transistors, inserted between the nodes Xa and Xb to be discharged and said second supply line VSS and having gate terminals cross-connected to said nodes Xb and Xa to be discharged.

The reading circuit 10 comprises also a third MTA and a fourth n-channel comparing transistor MTB of the same type as transistors MNA and MNB.

Said transistors MTA and MTB are diode-connected and in series with the transistors MNA and MNB.

In addition, the series of transistors MNA and MTA, inserted between the node Xa and the second supply line VSS substantially implements the assembly of the comparator circuit 13a and the switch circuit 12a relating to the selected cell.

In other words, the series of transistors MNB and MTB, inserted between the node Xb and the second supply line VSS substantially implements the assembly of the comparator circuit 13b and the switch circuit 12b relating to the reference cell.

The nodes Xa and Xb to be discharged are connected, in turn, to said second supply line VSS by means of respective capacitors Ca and Cb and n-channel pre-charge transistors MRA and MRB connected in parallel and receiving on the gate terminals thereof a pre-charge signal PR.

The reading circuit 10 of FIG. 6 comprises also a first and a second p-channel mirror transistors MPA and MPB, inserted between a common p-channel transistor MRC and said nodes Xa and Xb to be discharged.

Moreover, the transistors MPA and MPB have the gate terminals connected to the gate terminals of corresponding p-channel mirror transistors, MP1A and MP1B, connected to said first supply line VDD and having the gate terminals connected to the respective drain terminals.

In particular, the transistor MP1A mirrors on the transistor MPA the current Isel relating to the selected cell, transmitting it then to the capacitor Ca which integrates it, by generating on the node Xa a voltage ramp. In other words, the transistors MPA and MP1A, together with the capacitor Ca, implement the integration current/voltage conversion circuit 11a relating to the selected cell.

Likewise, the transistor MP1B mirrors on the transistor MPB the current Iref relating to the reference cell, transmitting it then to the capacitor Cb which integrates it, by generating on the node Xb a voltage ramp. In other words, the transistors MPB and MP1B, together with the capacitor Cb, implement the integration current/voltage conversion circuit 11b relating to the reference cell.

The common transistor MRC receives said pre-charge signal on the gate terminal.

Said pre-charge signal PR is a logic signal activating the connection of the nodes Xa and Xb to said second supply line VSS by means of the pre-charge transistors MRA and MRB, and of the common source terminals of the mirror transistors MPA and MPB to said first supply line VDD.

The transistors MRA, MRB and MRC allow, thus, the reading circuit 10 starting conditions (time t0) to be set.

Advantageously according to the invention, the freezing transistors MTA and MTB allow an increase of the voltage Vm absolute value with respect to known solutions having similar base structure. Assuming that the substrate terminals of the n-channel transistors are connected to the second supply line VSS, while those of the p-channel transistors are connected to the first supply line VDD, the starting voltage of the series structure comprising the transistors MNA and MTA (and, likewise, the series structure comprising the transistors MNB and MTB) determines the "freezing" of the differential voltage at a value equal to:

$$Vm=VGS(MNA)+VGS(MTA)=Vth(MNA)+Vth(MTA)-VSS;$$

that is, given VSS=0V and Vth(MNA)=Vth(MNB), Vm=2Vtb.

The tripping voltage value obtained is thus substantially twice the value of the known base solution (equal to Vth).

In this way, even though the starting voltage of the discharge block of the slowest node from the series MNA–MTA (or, likewise, MNB–MTB) is fixed, the value thereof is increased with respect to the supply voltage VSS, ensuring an increased noise immunity margin.

The above-derived relation applies if the transistors MNA and MTA have the same value as the threshold voltage. In practice, the schematic view of FIG. 6 provides the connection of the substrate terminals of MNA and MTA to the second line VSS. The transistor MNA threshold voltage is therefore higher than the transistor MTA voltage because of the body effect (VBS (MNA)>VBS (MTA)).

Therefore, the margin with respect to the second supply voltage VSS is further increased by some hundreds of mV if compared to the value 2Vth.

Moreover, advantageously according to the invention, by using three-well technologies providing the integration of n-channel transistors in p-doped insulated bags with respect to the p substrate by means of a n-doped bag, it is possible to connect the transistor MNA (MNB) substrate terminal to the corresponding source terminal. According to this solution, the transistor MNA (MNB) threshold voltage is equal to the voltage of the transistor MTA, confirming the validity of the above-mentioned relation.

Depending on the different cases and/or needs, it is possible to implement one of the two solutions (connection of the substrate terminal to the second supply line VSS or to the corresponding source terminal).

Depending on the process parameters or, in particular, the n-channel transistor threshold voltage value, it is possible, advantageously according to the invention, to set on design the starting voltage of the slowest node discharge block. It is also possible to realize an n-channel device having different threshold voltage values, for example by using conventional planted-channel transistors and non-planted-channel transistors (natural transistors).

It is also possible to replace the NMOS transistors MNA and MNB by two non-volatile memory cells having programmed threshold at Vm value.

In practice, the simultaneous saturation of the voltages Vref and Vsel to the first supply voltage VDD is to be avoided since it will prevent any discrimination of the difference thereof. The discharge of the slowest node can start when the fastest node reaches the value VDD. The highest settable value of the starting threshold of the slowest node discharge block is therefore equal to VDD.

It is worth noting that, also in the embodiment just described with reference to FIG. 6, the "freezing" voltage Vm is not differential but it refers to the level VSS, as in the prior art solution. The reading circuit 10 according to the invention increases therefore the noise margin with respect to known solutions since the "freezing" instant is conveniently delayed with respect to the detection instant of the difference sign |Vsel–Vref|. The margin voltage is therefore increased; it is also possible to discriminate in a reliable way currents being very close to each other and having high absolute value.

Some advantages of the reading circuit 10 according to the invention are now set forth.

First of all, an increased noise immunity margin is achieved with respect to the supply voltages with a differential control voltage of the discharging block (equal to |Vsel–Vref|). Any noise superposed to both current signals Isel or Iref relating to the selected cell and to the reference cell respectively, involves such an identical variation in voltages Vref and Vsel as to avoid the triggering of undesirable discharges of the control nodes Vref or Vsel.

Moreover, an increased immunity to common mode variations (variations in process, temperature etc.) is achieved since the differential control voltage |Vsel–Vref| and the threshold voltage Vm are determined on design and are therefore independent of the process.

Finally, the reading circuit 10 according to the invention is suitable for application with forced multilevel memories (more than two bits per cell) since the margin voltage Vm can be easily sized according to the resolution of the levels to be discriminated.

In practice, the basic idea implemented in the reading circuit 10 according to the invention is to control in an analogue way the signal "freezing" instant in order to have an adequate margin with respect to the possible signal variations (noise, supply voltages, temperature).

The margin value is thus determined on design and can be made independent of process parameters.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A reading circuit for semiconductor non-volatile memories connected to at least one selected cell and at least one reference cell, comprising: current/voltage conversion circuits receiving at the input thereof a first current flowing through the selected cell and a second current flowing through the reference cell and providing respectively on a first node a first selected cell voltage and on a second node a second reference cell voltage; at least one differential amplifier having inputs connected to the first and second nodes and having an output terminal effective to supply a logic signal correlated to the information contained in said selected cell; at least one first voltage-controlled discharge switch circuit connected to the input of said first node and to a voltage reference, a second voltage-controlled discharge switch circuit connected to the input of said second node and to the voltage reference; and at least a first and a second voltage comparator circuit receiving at the input thereof said first selected cell voltage and said second reference cell voltage, said comparator circuits are configured for controlling voltage in said first and second voltage-controlled discharge switch circuits.

2. The reading circuit of claim 1, wherein said current/voltage conversion circuits generate on said first and second nodes voltage values having amplitude correlated by an increasing function to the current values received at the input thereof and to the time lapsed from a starting condition in which the voltages are predetermined at an initial value corresponding to said voltage reference.

3. The reading circuit of claim 2, wherein said current/voltage conversion circuits comprise at least a current mirror inserted between a first supply line and said first and second nodes and at least one capacitor inserted between said nodes and a second supply line, said current mirrors comprising at least first respective mirror transistors having the source terminals in common and at least second respective mirror transistors connected to said first supply line and effective to mirror on said first respective mirror transistors said first and second currents flowing through the selected and the reference cells respectively.

4. The reading circuit of claim 3, comprising at least first, second and third pre-charge transistors, receiving on the respective gate terminals a pre-charge logic signal, said first pre-charge transistor coupled between said first node and said second supply line, said second pre-charge transistor coupled between said second node and said second supply line and said third pre-charge transistor coupled between said first supply line and the common source terminals of said first mirror transistors.

5. The reading circuit of claim 4, wherein said pre-charge logic signal is a logic signal activating the connection of said first and second nodes to said second supply line by means of said first and second pre-charge transistors, and the connection of the common source terminals of said first mirror transistors to said first supply line by means of said third pre-charge transistor, so to set the initial conditions of the reading circuit.

6. The reading circuit of claim 1, wherein said comparator circuits are differential comparators of the module of the difference between said selected cell voltage and said reference cell voltage with respect to a value corresponding to a tripping voltage for the start-up of said first and second voltage-controlled discharge switch circuits, said value being a fixed voltage reference.

7. The reading circuit of claim 6, wherein said comparator circuits provide said first and second voltage-controlled discharge switch circuits with a digital control signal assuming logic values that are complementary to each other according to the result of the comparison of said module with said fixed reference value.

8. The reading circuit of claim 6, wherein said differential amplifier comprises, in turn, first, second, third and fourth MOS transistors, inserted between first and a second supply lines of the reading circuit, said third and fourth transistors having the source terminals connected to said first supply line, the gate terminals reciprocally connected and the drain terminals connected to the respective drain terminals of said first and second transistors, said third transistor being a diode-configuration, with the drain terminal connected to the gate terminal and said first and second transistors having the source terminal connected to each other and to said second supply line through a bias current generator, and the gate terminals connected to said second and first nodes respectively in order to receive said second reference cell voltage and said first selected cell voltage, as well as a resistance inserted between the source terminal of said first transistor and the bias current generator, said resistance being effective to fix the value of a differential amplifier tripping voltage.

9. The reading circuit of claim 8, wherein said third and fourth MOS transistors implement an active current mirror.

10. The reading circuit of claim 6, wherein said comparator circuits and said discharge switch circuits comprise at least first and second comparing transistors inserted between said first and second nodes and a supply line and having gate terminals cross-connected to said nodes, as well as a third and a fourth comparing transistor, diode-connected and in series to said first and second comparing transistors.

11. The reading circuit of claim 6, wherein said selected cell voltage coincides with the value corresponding to the tripping voltage for said discharge switch circuit start-up.

12. The reading circuit of claim 1, wherein said first and second voltage-controlled discharge switch circuits activate the connection of the nodes to a supply line according to the value of a digital control signal inputted by said comparator circuits.

13. The reading circuit of claim 12, wherein said first and second voltage-controlled discharge switch circuits comprise fifth and sixth MOS transistors inserted, in series, between said first and second nodes and a ground reference voltage.

14. The reading circuit of claim 13, wherein second and fourth MOS transistors of the differential amplifier have the drain terminals in common connected to the gate terminal of said fifth MOS transistor of the first and second voltage-controlled discharge switch circuits, while said sixth MOS transistor of the first and second voltage-controlled discharge switch circuits has the gate terminal connected to said first supply line, so that the control on the impedance between said first and second nodes and said ground reference is performed with a voltage equal to the difference between said first selected cell voltage and said second reference cell voltage.

15. The reading circuit of claim 1, wherein said differential amplifier provides said output terminal with a logic value corresponding to a logic value stored in the selected cell or the negative thereof, and correlated to the absolute value of the difference between the voltages Vref and Vsel.

16. A reading circuit for non-volatile memories connected to at least one selected cell and at least one reference cell, the circuit comprising:

first and second current/voltage conversion circuits receiving at their respective inputs thereof a first current flowing through the selected cell and a second current flowing through the reference cell and providing respectively on their outputs on a first node a selected cell voltage and on a second node a second reference cell voltage;

at least one differential amplifier having inputs connected to the first and second nodes and having an output terminal configured to supply a logic signal correlating to the information contained in the selected cell;

at least one first voltage-controlled discharge switch circuit connected to the input of the first circuit node and to a voltage reference, a second voltage-controlled discharge switch circuit connected to the input of the second node and to the voltage reference, and at least a first and a second voltage comparator circuit receiving at their respective inputs thereof the selected cell voltage and the reference cell voltage, the comparator circuits comprising differential comparators of the module of the difference between the selected cell voltage and the reference cell voltage with respect to a value corresponding to a tripping voltage for the startup of the discharge switch circuits, the value corresponding to a tripping voltage that comprises a fixed voltage reference.

17. A reading circuit for semiconductor non-volatile memories connected to at least one selected cell and at least one reference cell, the circuit comprising:

first and second conversion circuits coupled to receive a first current from the selected cell and as second current from the reference cell, respectively, and configured to generate a first voltage and a second voltage in response thereto;

a differential amplifier having first and second inputs coupled to receive the first and second voltages at first and second nodes, respectively, and to generate a logic signal at an output thereof that is correlated to a state of the selected cell;

a first switching circuit and a second switching circuit coupled to the first and second nodes, respectively, each switching circuit further coupled to a voltage reference terminal, the first and second switching circuits configured to selectively couple and uncouple the respective first and second nodes to the voltage reference terminal in response to a control signal; and first and second comparator circuits configured to receive the first and second voltages and to send the control signal to each of the first and second switching circuits to couple the respective node to the voltage reference terminal when the magnitude of the difference between the first and second voltages is equal to or greater than a tripping voltage value.

18. The circuit of claim 17, wherein the differential amplifier comprises in turn, first, second, third and fourth MOS transistors, inserted between a first supply line and a second supply lines of the reading circuit, said third and fourth transistors having source terminals connected to the first supply line, and having gate terminals reciprocally connected and the drain terminals connected to the respective drain terminals of the first and second transistors, the third transistor having a diode-configuration, with the drain terminal connected to the gate terminal and the first and second transistors having the source terminal connected to each other and to the second supply line through a bias current generator, and the gate terminals connected to the second and first nodes respectively in order to receive the second voltage and the first voltage, as well as a resistance inserted between the source terminal of the first transistor and the bias current generator, the resistance configured to fix the value of the tripping voltage valve.

19. A reading circuit for semiconductor non-volatile memories connected to at least one selected cell and at least one reference cell, the circuit comprising:

first and second conversion circuits coupled to receive a first current from the selected cell and a second current from the reference cell, respectively, and configured to generate a first voltage and a second voltage in response thereto;

a differential amplifier having first and second inputs coupled to receive the first and second voltages at first and second nodes, respectively, and to generate a logic signal correlated to a state of the selected cell; and a first and second discharge circuit coupled between the first and second nodes, respectively, and a voltage reference, and configured to couple the respective node to the voltage reference when the magnitude of the difference between the first and second voltages is equal to or greater than a predetermined voltage value.

20. A reading circuit for semiconductor non-volatile memories connected to at least one selected cell and at least one reference cell, the circuit comprising:

first and second conversion circuits coupled to receive a first current from the selected cell and a second current from the reference cell, respectively, and configured to generate a first voltage and a second voltage in response thereto;

a differential amplifier having first and second inputs coupled to receive the first and second voltages at first and second nodes, respectively, and to generate a logic signal correlated to a state of the selected cell; and a first and second discharge circuit coupled between the first and second nodes, respectively, and a voltage reference, the first and second discharge circuits configured to receive the first and second voltages, the first and second discharge circuits configured such that the first and second node having the slowest variation in voltage is coupled to the voltage reference when the magnitude of the difference between the first and second voltages is equal to or greater than a fixed reference voltage.

* * * * *